Figure 1:
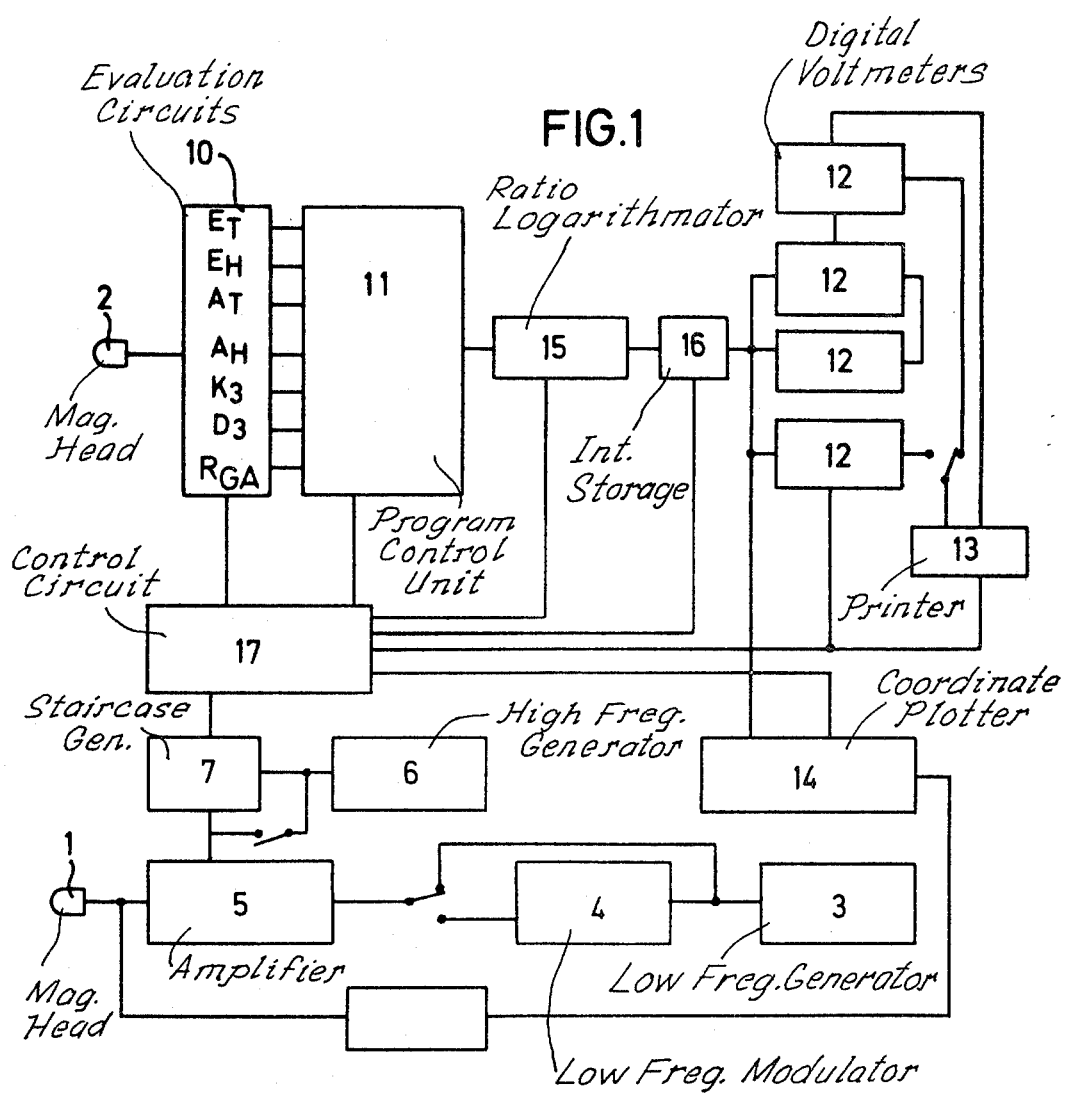

United States Patent [19]

Pfefferkorn

[11] 4,251,882

[45] Feb. 17, 1981

[54] METHOD AND APPARATUS FOR MEASURING THE ELECTROACOUSTIC PROPERTIES OF MAGNETIC TAPES

[75] Inventor: Dietmar Pfefferkorn, Hemsbach, Fed. Rep. of Germany

[73] Assignee: BASF Aktiengesellschaft, Ludwigshafen am Rhein, Fed. Rep. of Germany

[21] Appl. No.: 952,613

[22] Filed: Oct. 18, 1978

[30] Foreign Application Priority Data

Oct. 21, 1977 [DE] Fed. Rep. of Germany ....... 2747333

[51] Int. Cl.³ ...................... G01R 31/20; G06F 11/00
[52] U.S. Cl. ................................... 371/28; 324/212; 360/25; 371/21
[58] Field of Search ................. 340/146.1 F; 235/302, 235/302.2; 360/25, 31; 324/212; 364/579; 371/21, 28

[56] References Cited

U.S. PATENT DOCUMENTS

| Re. 24,641 | 4/1959 | Reynolds | 360/25 |
|---|---|---|---|
| 3,506,814 | 4/1970 | MacDonald et al. | 235/302.2 |
| 3,659,195 | 4/1972 | Cardoze et al. | 324/212 |
| 3,686,682 | 8/1972 | Behr et al. | 360/25 |
| 3,717,846 | 2/1973 | Kanda et al. | 340/146.1 F |
| 4,003,084 | 1/1977 | Fletcher et al. | 360/25 |

*Primary Examiner*—Charles E. Atkinson
*Attorney, Agent, or Firm*—Keil & Witherspoon

[57] ABSTRACT

A method and apparatus for measuring the electroacoustic properties of magnetic tapes by means of recorded test signals of varying frequency and amplitude, wherein measured values of the reproduced signals which depend on the biassing current and correspond to predetermined parameters are obtained; for each of the relevant values of the biassing current the amplitude of the test signal to the recorded is varied until the predetermined value of the reproduced signal is attained, and the measured value of the reproduced signal obtained in this way is registered, an amplitude-modulated test signal is recorded and, by means of a test programming unit and upon the attainment of a parameter value which controls this programming unit, the relevant measured value of the reproduced signal to be determined is transmitted to an intermediate storage device for further evaluation and the biassing current is varied in order to determine the next value to be measured.

3 Claims, 4 Drawing Figures

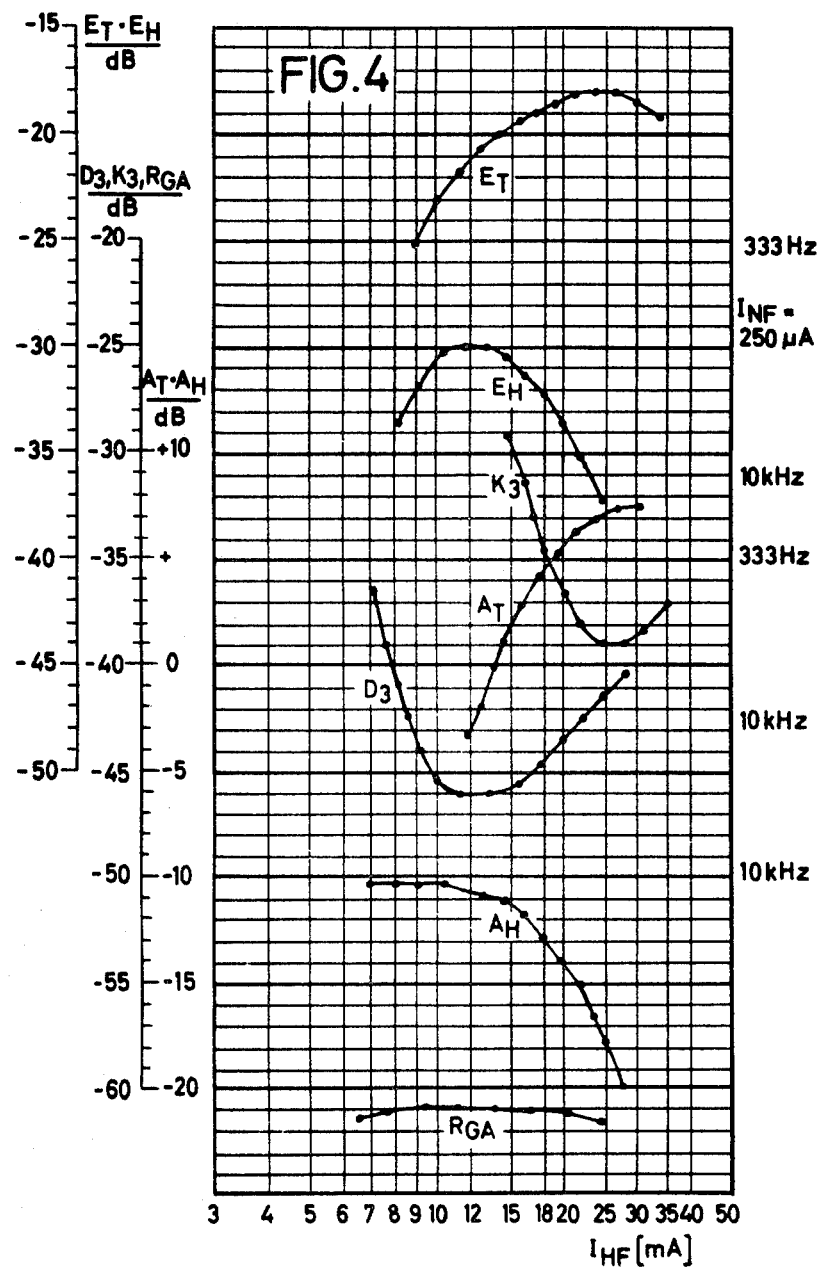

METHOD AND APPARATUS FOR MEASURING THE ELECTROACOUSTIC PROPERTIES OF MAGNETIC TAPES

This invention concerns a method of measuring the electroacoustic properties of magnetic tapes by means of recorded test signals of varying frequency and amplitude. It also relates to measuring apparatus for carrying out this method.

For this assessment of the electroacoustic properties of magnetic tapes which are to be employed as audio tapes, usually the following tape properties are used:

$E_T$ = sensitivity at long wavelengths
$E_H$ = sensitivity at short wavelengths
$A_T$ = maximum output level at long wavelengths
$A_H$ = *maximum output level at short wavelengths*
$K_3$ = distortion ratio at long wavelengths
$D_3$ = difference tone distortion at short wavelengths
$R_{GA}$ = dynamic range, related to a reference level.

Up to now, these properties were ascertained in dependence on the bias of the magnetic tape for different parameters, such as distortion ratio and saturation magnetization, by the manual adjustment of the test conditions resulting in this way. After the individual measurements, mathematical calculations are necessary in many cases, in order to obtain the numerical value of a parameter, e.g. the distortion ratio, or the numerical value of the quantity to be ascertained which is suitable for graphic representation, for example in relation to a reference tape.

For example, in order to ascertain the quantity $A_T$, the recording level is raised until the reproduction voltage of the test signal on the magnetic tape appears with a third-harmonic distortion of 5%. For this purpose, the ratio of the third harmonic to the entire composite signal must be continuously calculated, in order to be able to read the reproduction voltage corresponding to 5%. Usually, this voltage is then referred to the value of a reference tape. This test program is repeated for various values of the biassing current if $A_T$ is to be graphically plotted in dependence on the bias. The other quantities are ascertained in a similar manner.

It is readily apparent that this test method is complex and takes a lot of time. Moreover, correct test results can only be obtained after a large number of measurements and the intermediate calculations associated therewith have been made. This applies particularly to the measurements of quantities $A_T$, $A_H$, $K_3$ and $D_3$.

Accordingly, an object of the present invention is to provide a method and an apparatus with which the quantities which are characteristic of the electroacoustic properties of a magnetic tape can be ascertained and displayed much faster, more reliably and more accurately than hitherto.

The method and apparatus according to the invention make possible automatic measurement of the quantities which are characteristic of the tape properties as well as the graphic recording of the test results. The required values can now be ascertained much faster, more reliably and more accurately than hitherto, even though the apparatus is much simpler to operate.

This means that the new method and apparatus are suitable not only for routine tests, e.g. quality control in production, but also for controlling the manufacture of magnetic tape with respect to the tape parameters.

Figure 2:
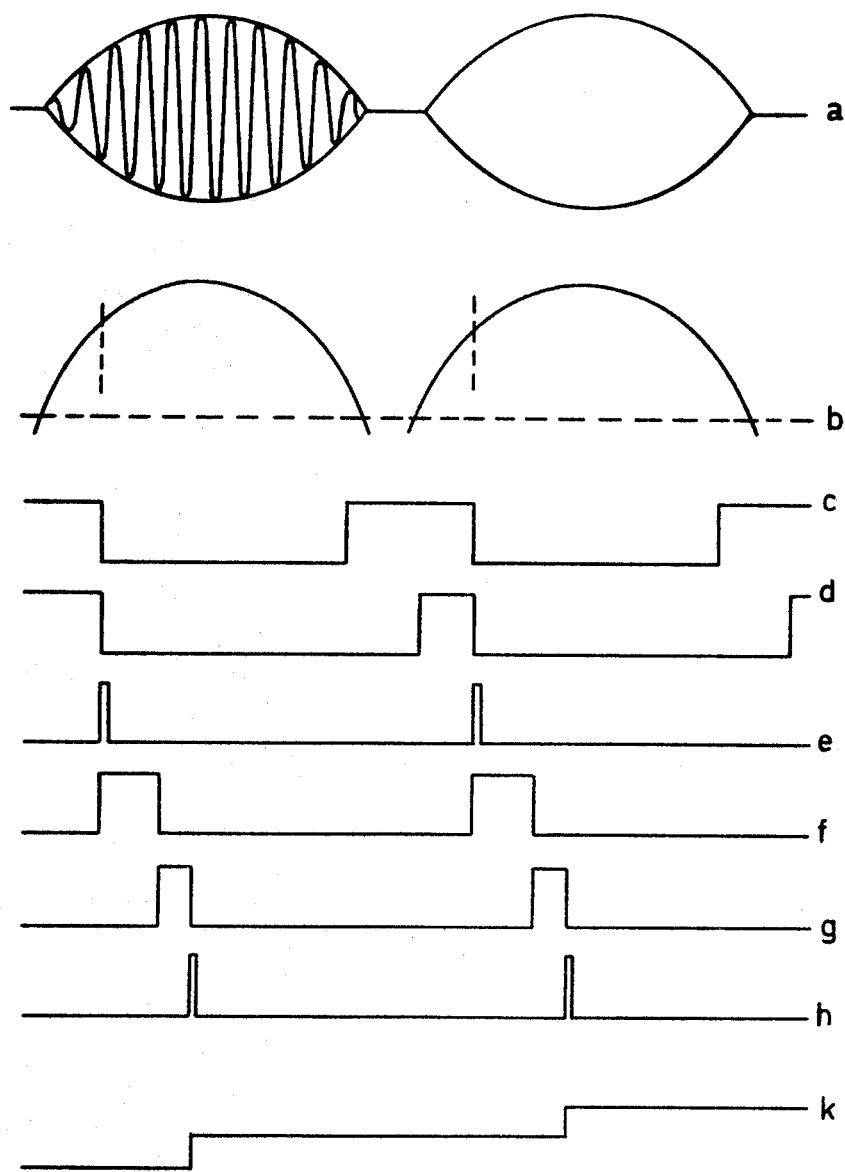
Figure 3:
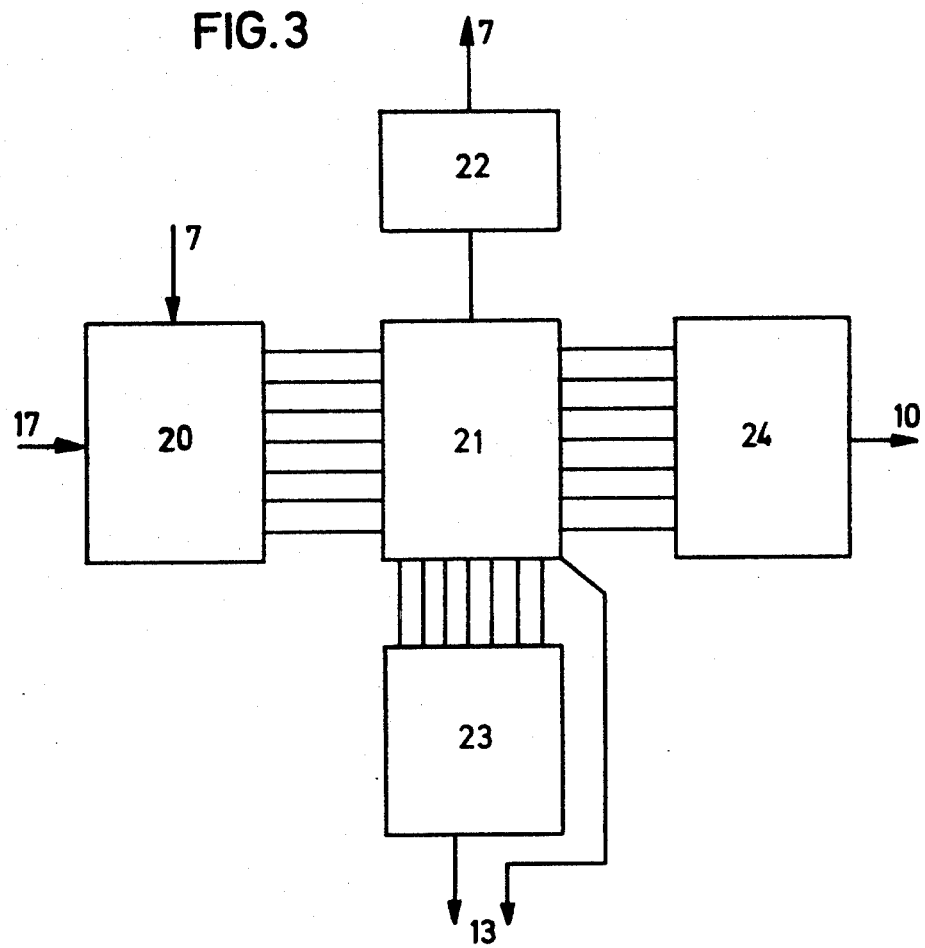

The invention will now be described in further detail with reference to an embodiment illustrated in the drawings, in which FIG. 1 is a block diagram of the apparatus of the invention, FIG. 2 is a diagram of the measuring sequence for the quantities $A_T$; $K_3$; $D_3$; as a function of time, FIG. 3 is a block diagram of the program control unit, and FIG. 4 shows diagrams of the quantities in dependence on the bias.

On a tape recording apparatus, not shown in further detail in the drawings, the magnetic tape to be examined is guided past the magnetic heads 1,2 for the recording and reproduction of test signals (FIG. 1). The test signal, generated by a low-frequency generator 3, is subjected in a low-frequency modulator 4 to amplitude modulation, see diagram a in FIG. 2. Via an amplifier 5 the modulated signal is taken to the recording head 1 to which, for the purpose of biassing the magnetic tape, a high-frequency current from a high-frequency generator 6 is supplied. The bias is adjusted by a controllable staircase generator 7 by means of which the amplitude of the high-frequency voltage can be varied in steps.

The test signal, scanned from the magnetic tape by means of reproducing head 2, is taken to the evaluation circuits 10 for the quantities $E_T$; $E_H$; $A_T$; $A_H$; $K_3$; $D_3$; $R_{GA}$ (shown in FIG. 4 in dependence on the biassing current $I_{HF}$) which are connected by means of program control unit 11 to digital voltmeters 12 for absolute and relative value indication, and to a printer 13 and a coordinate plotter 14. Inserted in this connection are a ratio logarithmator 15 and an intermediate storage device 16 which consists of a controllable scanning unit for the measured values presented by the logarithmator 15 and of a hold unit. Storage devices of this type are known as "sample and hold" devices and are available commercially. The ratio logarithmator 15 is also a commercial electronic component by means of which the measured voltages of the reproduced signal can be converted into decibels (db). Such a ratio logarithmator is available as Model 756 from Analog Devices, Route 1 Industrial Park; P.O. Box No. 280; Norwood, Mass. 02062.

The circuit 17 controlling the measuring sequence, which consists of a threshold switch and a pulse generator controlled by the latter and comprising delay elements, continuously receives from the logarithmator 15 the values of the test signal only just scanned at the evaluating circuits 10. The threshold switch which responds to a predetermined value, for example a 5% distortion as parameter, which is converted in the logarithmator 15 into a voltage value, causes the pulse generator to transmit control pulses to the intermediate storage device 16, whereby the voltage of the test signal just sampled at this moment in time and belonging to a predetermined amplitude of the modulated recording current is taken over from the output of the logarithmator 15—which, to this end, has meanwhile been switched to the corresponding evaluating circuit—by the intermediate storage device. Until the next measured value is ascertained, the value being held in the intermediate storage device is passed to the indicating device 12 and to the printer 13 and co-ordinate plotter 14. The threshold switch of the control circuit 17 also acts upon the staircase generator 7 via delay elements, so that the voltage of the high-frequency generator is increased for the next measurement, once the measuring cycle has terminated. The printer 13 and the co-ordinate plotter 14 are likewise controlled by control circuit 17 by means of further delay elements.

The program controller 11 is composed of a pulse sequence generator 20, a level converter 21, a trigger stage 22, a BCD encoder 23 and a diode matrix 24 (FIG. 3).

The pulse sequence generator 20 consists of a programmable counter and exclusive-NOR circuits which switch on the relevant evaluating circuit 10 via the level converted 21 and the diode matrix 24. To this end, the pulse sequence generator 20 receives a counting pulse from control circuit 17 on termination of each measurement, and the first incoming counting pulse switches on one of the seven evaluating circuits 10 according to the program, this evaluating circuit remaining switched on until a programmable number of counting pulses has been counted, i.e. the measurements have been completed. The next-following counting pulse changes over to the next evaluating circuit 10.

The level converter 21 generates suitable signals for the diode matrix 24 and the BCD encoder 23 to which the printer 13 is connected, so that when the measured values are printed out, the number of the associated evaluating circuit is also printed out. Furthermore, the level converter 21 enables the programmable automatic changeover of the evaluating circuits 10 to be replaced by manual operation. A delay unit of the level converter ensures that the first test result obtained after a changeover will only be printed out when the entire system has attained a stationary condition.

For the purpose of graphic representation of the test results, the level converter 21 generates via the trigger stage 22, with every changeover between two evaluating circuits 10, a pulse for starting the staircase generator 7 which blocks the pulse generator 20, and thus prevents the changeover to another evaluating curcuit until the staircase generator 7 returns to its initial condition after having reached its maximum value.

The above-described circuits are well known to those skilled in the art and have therefore not been illustrated in further detail.

For a better understanding of the method and apparatus described above in general terms, the measuring sequence will now be described with reference to the time diagrams illustrated in FIG. 2.

Let us assume that, when measuring for example quantity $A_T$, an amplitude-modulated test signal (diagram a) having a frequency of 333 Hz has, at the instant $t_o$, the amplitude at which the distortion of the scanned test signal attains 5% (diagram b). The control circuit 17 responding to the attained distortion causes the intermediate storage device 16 to be cleared by means of a needle pulse (diagram e) by triggering a comparator in the control circuit 17 (diagram c) which at the instant $t_3$ is automatically reset because the distortion has fallen below a predetermined value. At the instant $t_o$, the comparator simultaneously starts a delay element which allows a new measurement to be made at the instant $t_4$ after its delay period has lapsed (diagram d).

Then the test signal voltage corresponding to the distortion value is accepted by the intermediate storage device (diagram f) and is printed out (diagram g) by a delayed command pulse at the instant t. Progressive switching of the biassing voltage (diagram k) is effected by a pulse (diagram h) delayed relative to the instant $t_o$ and acting upon the staircase generator 7 at the instant $t_2$ at the end of the print command. The next measurement for ascertaining another value can only begin at the instant $t_4$ at the earliest, when the time difference between the recording head 1 and the reproducing head 2 is taken into account, so that the next measured value can be ascertained when the distortion of 5% is reached again at the instant $t_5$. The interval between the mutually corresponding instants $t_o$–$t_5$ is equal to the time interval between the two magnetic heads 1 and 2 plus the time required for the evaluation and the printout of the measured value. The modulation frequency is so chosen that, within this time interval, a measured value may also be found for the other quantities $A_H$, $K_3$, $D_3$, for the ascertainment of which an amplitude-modulated test signal is needed.

$K_3$ and $D_3$ are measured in the same way, the size of the parameter being a predetermined value of the reproduction voltage of the test signal.

When measuring $A_H$, the magnetic tape to be examined is magnetized to saturation with a signal having a frequency of 10 kHz for example, and, when saturation occurs, the value $A_H$ of the reproduction voltage is measured and recorded.

The quantities $E_T$, $E_H$ and $R_{GA}$ may also be ascertained with the apparatus of the invention using the same measuring sequence, the test signal not being modulated in this case. Here, the processing of the measured values is not controlled by a test signal parameter to be measured at the same time, but by means of a time interval circuit within the control circuit. For example, at a tape speed of 4.75 cm/s, 3 seconds are needed for every measured value.

Experiments with the apparatus of the invention have shown that, at a tape speed of 4.75 cm/s, a graphic display of a quantity, consisting of 10 points, can be produced within 30 seconds.

I claim:

1. In a method of measuring the electroacoustic properties of magnetic tapes by means of recorded test signals of varying frequency and amplitude, in which measured values of the reproduced signals which depend on the biassing current and correspond to predetermined parameters related to the magnetic tape being tested, are determined by varying for each of the relevant values of the biassing current the amplitude of the test signal to be recorded until the predetermined parameter value of the reproduced signal is attained, and by registering the measured value of the reproduced signal obtained in this way, the improvement that the recorded test signal is an amplitude-modulated signal and that by means of a test programming unit and upon the attainment of the parameter value which controls this programming unit, the relevant measured value of the reproduced signal is transmitted to an intermediate storage device for further evaluation.

2. An apparatus for carrying out the method according to claim 1, comprising a magnetic head for recording the test signal on a magnetic tape to be examined, and a magnetic head for reproducing the test signal, the magnetic tape being movable past the magnetic heads, and a low-frequency generator for the test signal and a high-frequency generator for biassing, which generators are adjustable with respect to the amplitudes of their voltages and connected to the recording head, and a circuit arrangement comprising evaluating circuits and indicating means connected to the reproducing head, said circuit arrangement embodying a ratio logarithmator and an intermediate storage device between the evaluating circuits and indicating means and a circuit which controls the measuring sequence, which circuit is provided with a threshold switch responding to the output of the ratio logarithmator, and with a pulse generator triggered by said logarithmator, for generating control pulses for the intermediate storage device, by means of which pulses the storage of a measured value is effected, and furthermore by a modulator operatively associated with the low-frequency generator, and a staircase generator which can be triggered via a delay element by the threshold switch of the control circuit, and means for varying in steps the amplitude of the voltage of the high-frequency generator.

3. An apparatus according to claim 2, and further including a program control unit operatively associated with said evaluation circuits, said unit comprising a programmable command store and a pulse counter, and means, operable in dependence on the evaluation circuit to be sampled, for controlling the control circuit with regard to the number of measured values and the measuring sequence, and for triggering a switching to the next evaluation circuit.

* * * * *